(12) United States Patent
Sasaki et al.

(10) Patent No.: US 12,177,979 B2
(45) Date of Patent: Dec. 24, 2024

(54) CIRCUIT ASSEMBLY

(71) Applicant: Sumitomo Wiring Systems, Ltd., Yokkaichi (JP)

(72) Inventors: Yoshikazu Sasaki, Yokkaichi (JP); Junya Aichi, Yokkaichi (JP); Hiroto Hashimoto, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 262 days.

(21) Appl. No.: 18/049,718

(22) Filed: Oct. 26, 2022

(65) Prior Publication Data

US 2023/0139630 A1 May 4, 2023

(30) Foreign Application Priority Data

Oct. 29, 2021 (JP) ................... 2021-177069

(51) Int. Cl.
*H05K 1/18* (2006.01)
(52) U.S. Cl.
CPC ...................... *H05K 1/18* (2013.01)
(58) Field of Classification Search
CPC ........................................................ H05K 1/18
USPC ........................................................ 361/760
See application file for complete search history.

(56) References Cited

U.S. PATENT DOCUMENTS

| 2014/0211439 | A1* | 7/2014 | Gerber | ............ | H05K 7/02 |
| | | | | | 361/767 |
| 2016/0157350 | A1* | 6/2016 | Yamamoto | ............ | H05K 1/11 |
| | | | | | 360/294 |
| 2019/0164878 | A1 | 5/2019 | Hattori et al. | | |

* cited by examiner

*Primary Examiner* — Andargie M Aychillhum
(74) *Attorney, Agent, or Firm* — Honigman LLP

(57) ABSTRACT

A circuit assembly includes: a first conductive member; a second conductive member; a holding member that is insulating and holds the first conductive member and the second conductive member; and an electronic component that includes a first terminal and a second terminal. The first conductive member has a first exposed surface exposed from the holding member so as to be electrically connected to the first terminal, the second conductive member has a second exposed surface exposed from the holding member so as to be electrically connected to the second terminal, the holding member includes an insulating portion located between the first exposed surface and the second exposed surface, a first conductive film is provided, the first conductive film covering at least a part of the first exposed surface and part of the insulating portion, and the first terminal is electrically connected to the first conductive film.

7 Claims, 4 Drawing Sheets

CIRCUIT ASSEMBLY

CROSS-REFERENCE TO RELATED APPLICATIONS

This application claims priority of Japanese Patent Application No. JP 2021-177069 filed on Oct. 29, 2021, the contents of which are incorporated herein.

TECHNICAL FIELD

The present disclosure relates to a circuit assembly.

BACKGROUND

Conventional circuit assemblies include a plurality of electronic components (switching elements), a plurality of busbars (source busbars) and control terminals (gate busbars) that constitute an electric power circuit, and a resin molded article that holds the busbars and the control terminals (see, for example, JP 2019-96769A). The resin molded article is formed as one piece with the busbars and the control terminals by insert molding. Each of the electronic components includes a source terminal and a gate terminal. The source terminals of the electronic components are connected to the busbars, and the gate terminals thereof are connected to the control terminals.

JP 2019-96769A is an example of related art.

SUMMARY

In conventional circuit assemblies, source terminals and gate terminals of electronic components are respectively connected to busbars and control terminals, and thus the distance between the busbars and the control terminals needs to match a terminal distance between the source terminals and the gate terminals. However, the distance between the busbars and the control terminals needs to be large and have at least a predetermined value so that molten resin enters the space between the busbar and the control terminal when insert-molding the resin molded article. Therefore, any electronic component having a terminal distance between a source terminal and a gate terminal smaller than the predetermined value cannot be mounted on a conventional circuit assembly, which thus results in a lack of versatility.

Therefore, it is an object of the present disclosure to enhance the versatility of a circuit assembly.

According to an aspect of the present disclosure, a circuit assembly includes: a first conductive member; a second conductive member; a holding member that is insulating and holds the first conductive member and the second conductive member; and an electronic component that includes a first terminal and a second terminal, wherein the first conductive member has a first exposed surface exposed from the holding member so as to be electrically connected to the first terminal, the second conductive member has a second exposed surface exposed from the holding member so as to be electrically connected to the second terminal, the holding member includes an insulating portion located between the first exposed surface and the second exposed surface, a first conductive film is provided, the first conductive film covering at least a part of the first exposed surface and part of the insulating portion, and the first terminal is electrically connected to the first conductive film.

According to the present disclosure, it is possible to enhance the versatility of a circuit assembly.

DETAILED DESCRIPTION OF PREFERRED EMBODIMENTS

Figure 1:
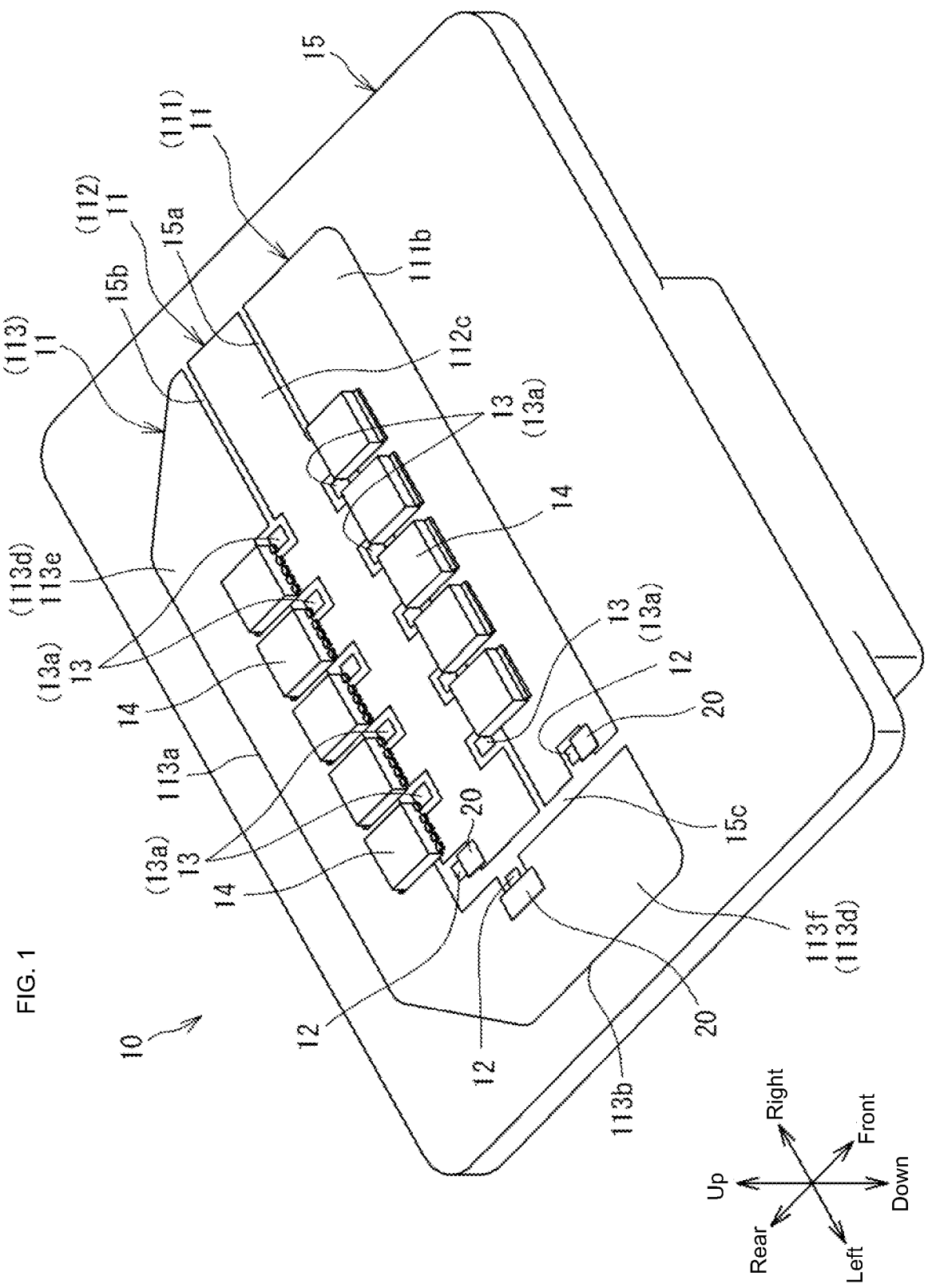
FIG. 1 is a perspective view illustrating a circuit assembly according to an embodiment.

First, embodiments of the present disclosure will be listed and described.

According to the present disclosure, a circuit assembly includes: a first conductive member; a second conductive member; a holding member that is insulating and holds the first conductive member and the second conductive member; and an electronic component that includes a first terminal and a second terminal, wherein the first conductive member has a first exposed surface exposed from the holding member so as to be electrically connected to the first terminal, the second conductive member has a second exposed surface exposed from the holding member so as to be electrically connected to the second terminal, the holding member includes an insulating portion located between the first exposed surface and the second exposed surface, a first conductive film covers at least a part of the first exposed surface and part of the insulating portion, and the first terminal is electrically connected to the first conductive film.

With the circuit assembly, if a terminal distance between the first terminal and the second terminal of the electronic component is smaller than a distance between the first exposed surface of the first conductive member and the second exposed surface of the second conductive member, there may be cases where the first terminal is located in an insulating portion provided on the front side of the first exposed surface while the second terminal is located on the second exposed surface. However, even in this case, if the first terminal is located on the first conductive film that covers part of the insulating portion, electrically connecting the first terminal to the first conductive film will bring the first terminal into a state of being electrically connected to the first exposed surface via the first conductive film. With this, it is possible to mount an electronic component having a relatively small terminal distance on the circuit assembly, making it possible to enhance the versatility of the circuit assembly. [0011] (2) Preferably, the first conductive film is a metal plating film.

In this case, it is possible to form the first conductive film more easily.

Preferably, a second conductive film covers at least a part of the second exposed surface and another part of the insulating portion, and the second terminal is electrically connected to the second conductive film.

In this case, even if the second terminal is located in an insulating portion provided on the front side of the second exposed surface while the first terminal is electrically connected to the first conductive film that covers part of the insulating portion, electrically connecting the second terminal to the second conductive film will bring the second terminal into a state of being electrically connected to the second exposed surface via the second conductive film as long as the second terminal is located on another part of the insulating portion. With this, it is possible to mount an electronic component having a smaller terminal distance on the circuit assembly, making it possible to further enhance the versatility of the circuit assembly.

Preferably, the second conductive film is a metal plating film.

In this case, it is possible to easily form the second conductive film.

Preferably, letting a direction in which the first terminal and the second terminal of the electronic component are lined up be a first direction, a terminal distance, in the first direction, between the first terminal and the second terminal is smaller than a distance, in the first direction, between the first exposed surface and the second exposed surface, and a distance, in the first direction, between the first conductive film and the second conductive film is not greater than the terminal distance.

In this case, since the distance between the first conductive film and the second conductive film is not greater than the terminal distance between the first terminal and the second terminal of the electronic component, the first terminal and the second terminal of the electronic component can be positioned respectively on the first conductive film and the second conductive film. Accordingly, by electrically connecting the first terminal and the second terminal of the electronic component to the first conductive film and the second conductive film respectively, the first terminal is electrically connected to the first exposed surface via the first conductive film, and the second terminal is electrically connected to the second exposed surface via the second conductive film. With this, it is possible to mount even an electronic component having a terminal distance smaller than the distance between the first exposed surface and the second exposed surface.

The following will describe details of the embodiment of the present disclosure with reference to the drawings. Note that at least some features of the embodiment described below may be combined with each other as appropriate.

Circuit Assembly

Figure 2:
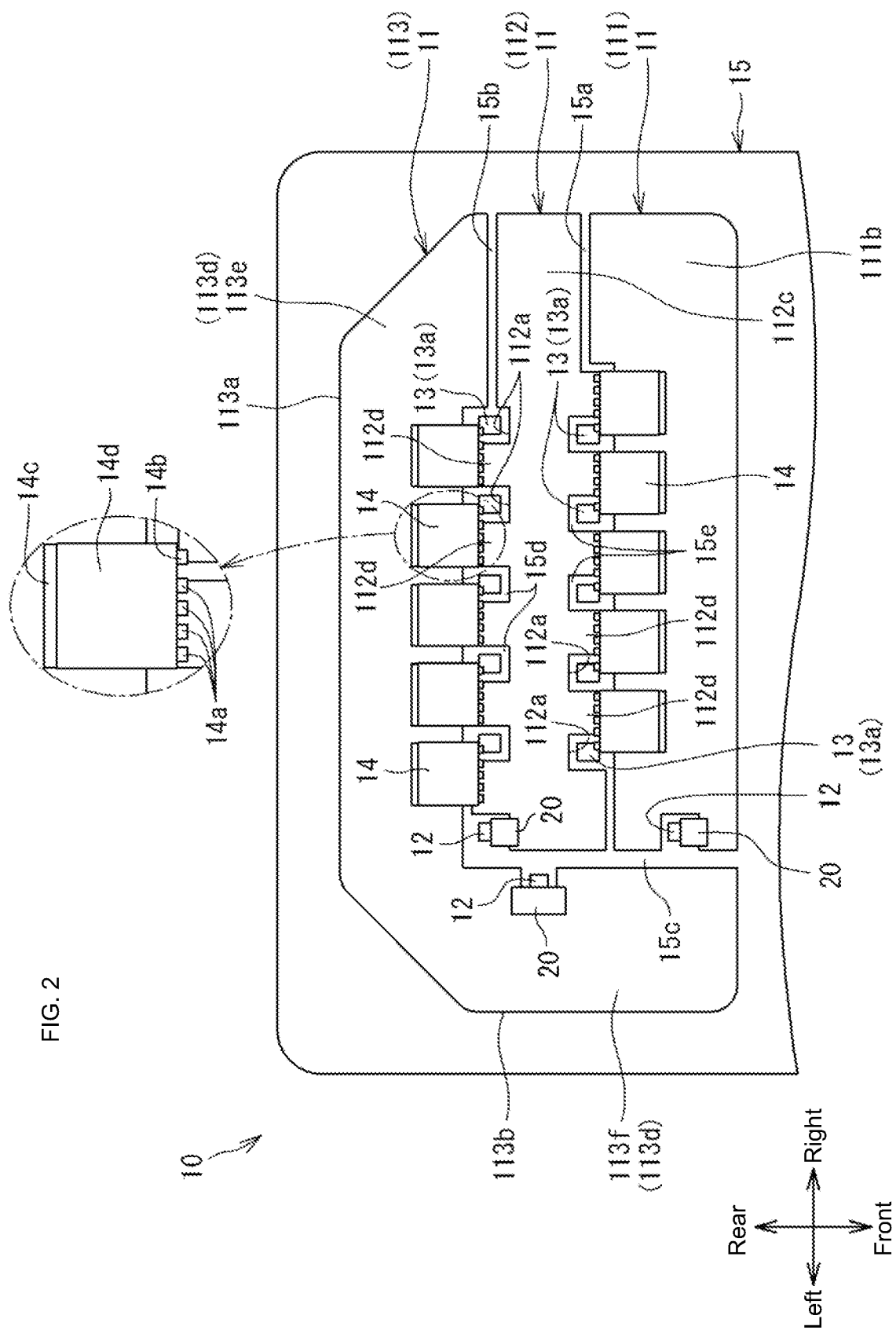
FIG. 2 is a plan view illustrating the circuit assembly.

FIG. 1 is a perspective view showing a circuit assembly 10 according to the present embodiment. FIG. 2 is a plan view of the circuit assembly 10. In the following description of the present embodiment, directions such as "up", "down", "right", "left", "front/forward", and "rear" are based on the directions indicated in FIG. 1.

In FIGS. 1 and 2, the circuit assembly 10 can be installed in various devices, and the circuit assembly 10 of the present embodiment is installed in a vehicle. More specifically, the circuit assembly 10 is assembled in an electrical junction box disposed at a midway position of a wiring route connecting a not-shown first in-vehicle device and a not-shown second in-vehicle device. The circuit assembly 10 includes a plurality of conductive plates (first conductive members) 11, a plurality of power supply terminals 12, a plurality of control terminals (second conductive members) 13, a plurality of electronic components 14, and a holding member 15. The plurality of conductive plates 11, the plurality of power supply terminals 12, and the plurality of control terminals 13 constitute an electric power circuit of the circuit assembly 10.

The circuit assembly 10 of the present embodiment includes three conductive plates 11. The number of conductive plates 11 and the number of power supply terminals 12 are the same, and one conductive plate 11 and one power supply terminal 12 are electrically connected to each other in a one-to-one relationship. Also, the circuit assembly 10 of the present embodiment includes ten control terminals 13.

The number of control terminals 13 and the number of electronic components 14 are the same, and one control terminal 13 and one electronic component 14 are electrically connected to each other in a one-to-one relationship. Note that the numbers of conductive plates 11, power supply terminals 12, control terminals 13, and electronic components 14 are suitably selected, and can be changed as appropriate.

The conductive plates 11 are manufactured by pressing a metal plate into a predetermined shape, and are referred to also as "busbars". The conductive plates 11 are preferably copper members made of, for example, pure copper, a copper alloy, or the like. The entire conductive plates 11 are conductors, and the conductive plates 11 are not formed by wiring patterns as formed on a typical printed board. The circuit assembly 10 of the present embodiment includes, as the plurality of conductive plates 11, a first conductive plate 111, a second conductive plate 112, and a third conductive plate 113.

The first conductive plate 111 is arranged at the frontmost position, and extends in a left-right direction. The second conductive plate 112 is arranged behind the first conductive plate 111 at a distance thereto, and extends in the left-right direction. On both front and rear sides of the second conductive plate 112, recesses 112a and protrusions 112d are formed alternately and sequentially in the left-right direction. In the present embodiment, on each of the front and rear sides of the second conductive plate 112, five recesses 112a and five protrusions 112d are formed alternately and sequentially.

The third conductive plate 113 includes a conductive body portion 113a that extends in the left-right direction, and a conductive extension portion 113b that extends forward from a left end portion of the conductive body portion 113a. The conductive body portion 113a is arranged behind the second conductive plate 112 at a distance thereto. A front portion of the conductive extension portion 113b extends to a position located on the left side of the first conductive plate 111. The conductive extension portion 113b is arranged on the left side of the first conductive plate 111 and the second conductive plate 112 at a distance thereto. Note that the shapes of the first conductive plate 111, the second conductive plate 112, and the third conductive plate 113 are not limited to the shapes employed in the present embodiment. For example, the third conductive plate 113 may be constituted only by the conductive body portion 113a.

The conductive plates 11 each have an exposed surface (first exposed surface) that is exposed from the holding member 15. Specifically, the first conductive plate 111 has an exposed surface 111b that is exposed from the holding member 15 to the upper side. The parts (located below the exposed surface 111b) of the first conductive plate 111 other than the exposed surface 111b are buried in the holding member 15. The second conductive plate 112 has an exposed surface 112c that is exposed from the holding member 15 to the upper side. The parts (located below the exposed surface 112c) of the second conductive plate 112 other than the exposed surface 112c are buried in the holding member 15.

The third conductive plate 113 includes an exposed surface 113d that is exposed from the holding member 15 to the upper side. The exposed surface 113d includes a main exposed surface 113e in the conductive body portion 113a that is exposed from the holding member 15, and an extended exposed surface 113f in the conductive extension portion 113b that is exposed from the holding member 15. The parts (located below the exposed surface 113d) of the third conductive plate 113 other than the exposed surface 113d are buried in the holding member 15.

The power supply terminals 12 are manufactured by pressing a metal wire material into a predetermined shape. The power supply terminals 12 are terminals made of metal. The power supply terminals 12 are preferably members made of copper such as, for example, pure copper, a copper alloy, or the like. In the present embodiment, the plurality of power supply terminals 12 are electrically connected to the respective conductive plates 11 via conductive films 20 such as metal plating films. The power supply terminals 12 supply power from the conductive plates 11 to a not-shown control substrate.

The control terminals 13 are manufactured by pressing a metal wire material into a predetermined shape. The control terminals 13 are terminals made of metal. The control terminals 13 are preferably members made of copper such as, for example, pure copper, a copper alloy, or the like. In the present embodiment, the plurality of control terminals 13 are disposed in the corresponding recesses 112a formed in the second conductive plate 112 on both the front and rear sides. The control terminals 13 each have an exposed surface (second exposed surface) 13a that is exposed from the holding member 15 to the upper side. The parts (located below the exposed surface 13a) of each control terminal 13 other than the exposed surface 13a are buried in the holding member 15. The control terminals 13 extend in a downward direction, and are electrically connected to the control substrate.

The electronic components 14 are, for example, semiconductor relays such as field effect transistors (FETs). The following describes a case where the electronic components 14 are field effect transistors, and the field effect transistors are denoted as "FETs". In the present embodiment, the plurality of FETs 14 include five FETs 14 that are placed in a rear-side portion of the exposed surface 111b of the first conductive plate 111 at intervals in the left-right direction, and five FETs 14 that are placed in a front-side portion of the main exposed surface 113e of the third conductive plate 113 at intervals in the left-right direction. Note that the electronic components 14 may be components other than FETs, and may also be mechanical relays, for example.

The holding member 15 is made of a thermoplastic resin. The holding member 15 is made of, for example, PPS (polyphenylene sulfide), PBT (polybutylene terephthalate), nylon, PP (polypropylene), PE (polyethylene), or the like, and is insulating. The holding member 15 of the present embodiment is made of PPS. The holding member 15 is formed by injection molding. In the present embodiment, the holding member 15 is manufactured by insert molding performed with the conductive plates 11, the power supply terminals 12, and the control terminals 13 placed in an injection molding die (not shown). With this, the holding member 15 holds the conductive plates 11, the power supply terminals 12, and the control terminals 13. The conductive plates 11, the power supply terminals 12, the control terminals 13, and the holding member 15 serve as an insert-molded article formed in one piece.

Terminals of Electronic Components

As shown in an enlarged portion in FIG. 2, each FET 14 includes a body portion 14d, a plurality of (four in the illustration) source terminals (first terminals) 14a, one gate terminal (second terminal) 14b, and one drain terminal 14c. The body portion 14d is cuboid. Note that the number of source terminals 14a is suitably selected, and can be changed as appropriate.

Figure 3:
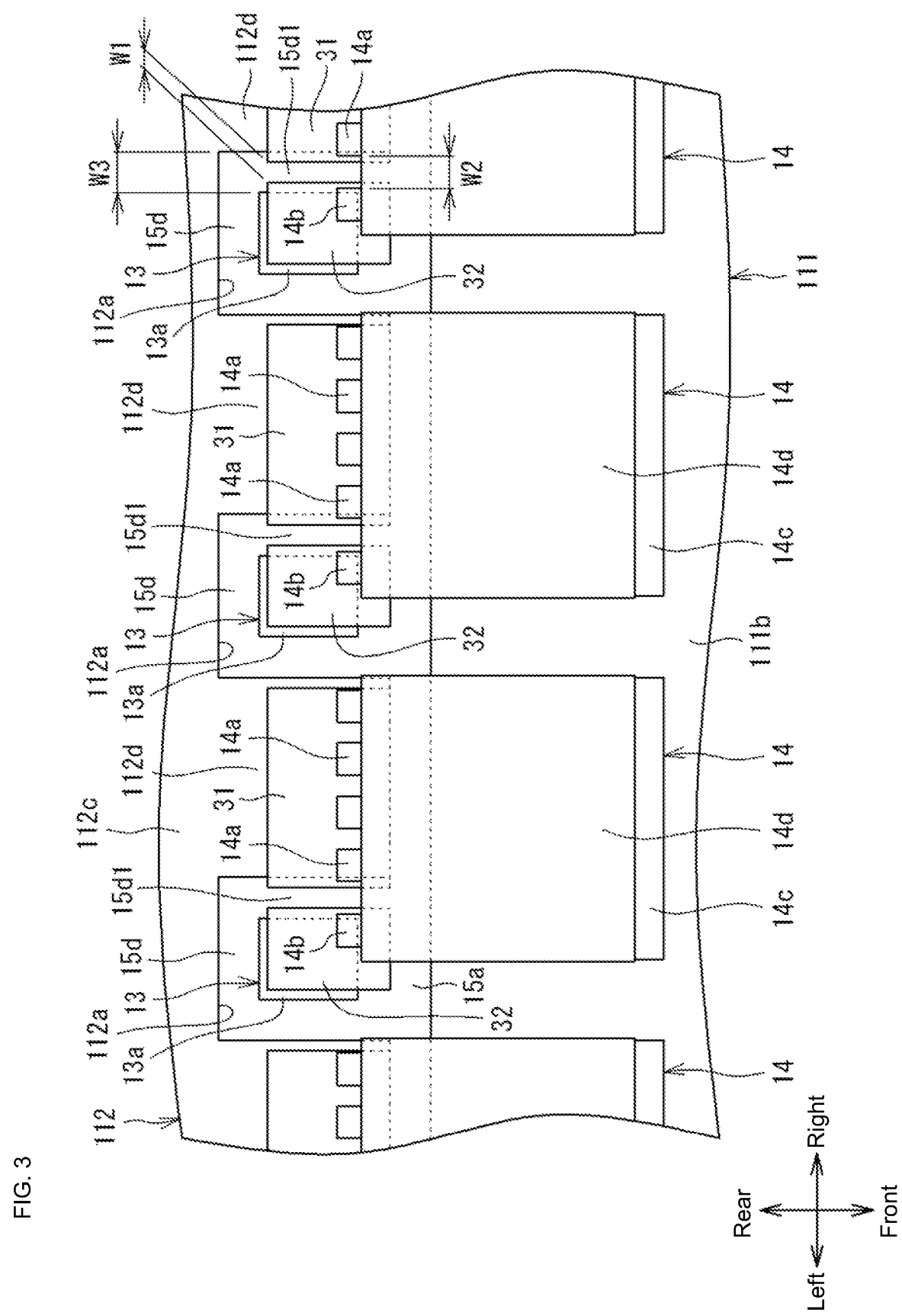
FIG. 3 is an enlarged plan view illustrating the vicinity of electronic components placed on an exposed surface of a first conductive plate.

FIG. 3 is an enlarged plan view showing the vicinity of the FETs 14 placed on the exposed surface 111b of the first conductive plate 111. As shown in FIG. 3, with respect to each of the FETs 14, the plurality of source terminals 14a are lined up in the left-right direction on the rear side of the body portion 14d. The source terminals 14a are electrically connected to the upper surface of the corresponding protrusion 112d formed on the exposed surface 112c of the second conductive plate 112. Details thereof will be described later.

The gate terminal 14b is lined up with the plurality of source terminals 14a in the left-right direction on the rear side of the body portion 14d. Specifically, the gate terminal 14b is provided on the left side of the leftmost source terminal 14a at a distance on the rear side of the body portion 14d. The gate terminal 14b is electrically connected to the exposed surface 13a of the corresponding control terminal 13. Details thereof will be described later. The drain terminal 14c is provided on the front side of the body portion 14d, and extends in the left-right direction. The drain terminal 14c is electrically connected to the exposed surface 111b of the first conductive plate 111 with solder or the like.

Figure 4:
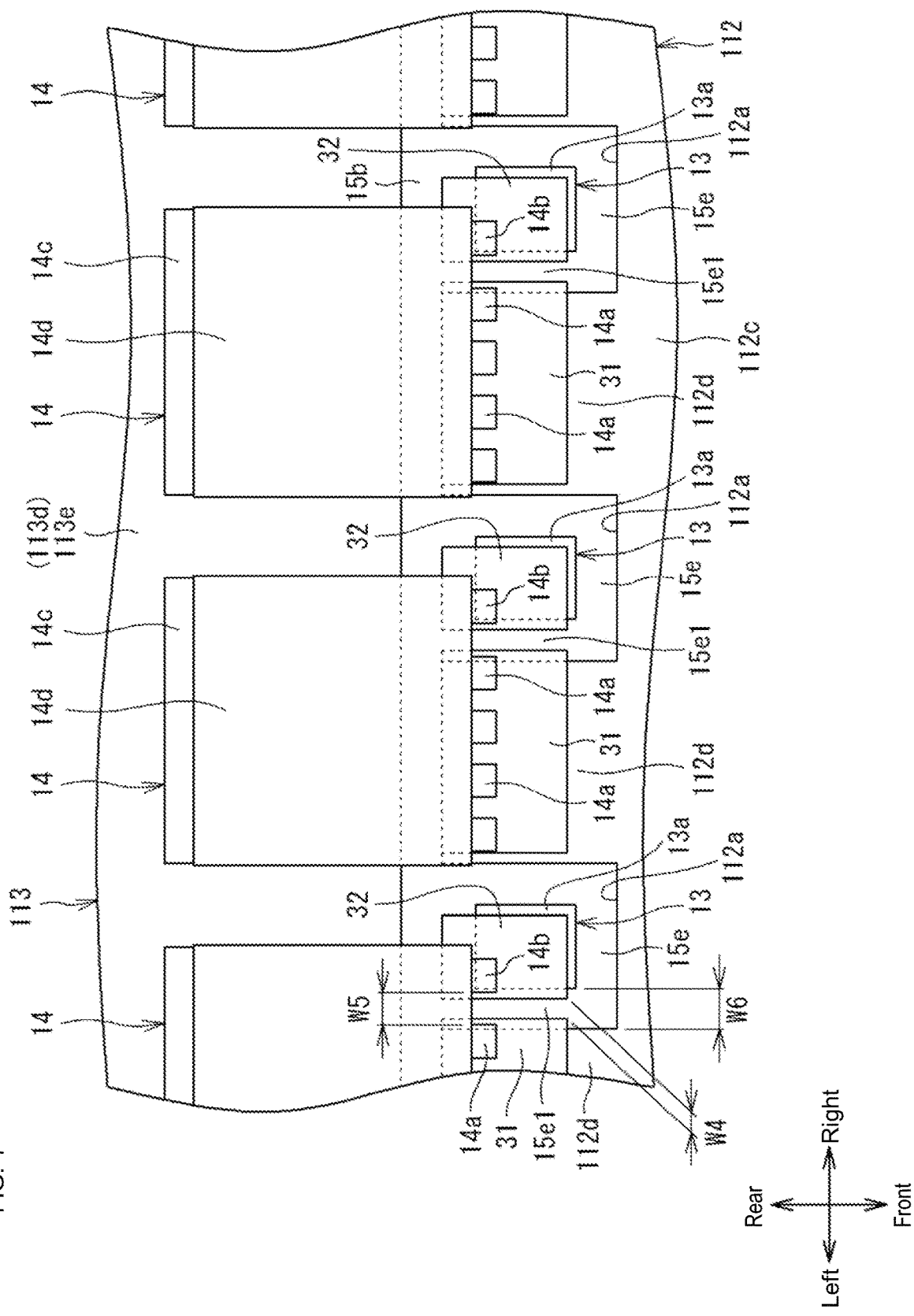
FIG. 4 is an enlarged plan view illustrating the vicinity of electronic components placed on a main exposed surface of a third conductive plate.

FIG. 4 is an enlarged plan view showing the vicinity of the FETs 14 placed on the main exposed surface 113e of the third conductive plate 113. As shown in FIG. 4, with respect to each of the FETs 14, the plurality of source terminals 14a of are lined up in the left-right direction on the front side of the body portion 14d. The source terminals 14a are electrically connected to the upper surface of the corresponding protrusion 112d formed on the exposed surface 112c of the second conductive plate 112. Details thereof will be described later.

The gate terminal 14b is lined up with the plurality of source terminals 14a in the left-right direction on the front side of the body portion 14d. Specifically, the gate terminal 14b is provided on the right side of the rightmost source terminal 14a at a distance on the front side of the body portion 14d. The gate terminal 14b is electrically connected to the exposed surface 13a of the corresponding control terminal 13. Details thereof will be described later. The drain terminal 14c is provided on the rear side of the body portion 14d, and extends in the left-right direction. The drain terminal 14c is electrically connected to the main exposed surface 113e of the third conductive plate 113 with solder or the like.

Insulating Portion

In FIG. 2, the holding member 15 includes, as insulating portions that insulate the exposed surfaces of adjacent conductive plates 11 from each other, a first insulating portion 15a, a second insulating portion 15b, and a third insulating portion 15c. The first insulating portion 15a is located between the exposed surface 111b of the first conductive plate 111 and the exposed surface 112c of the second conductive plate 112, and insulates the exposed surfaces 111b and 112c from each other. The second insulating portion 15b is located between the exposed surface 112c of the second conductive plate 112 and the main exposed surface 113e of the third conductive plate 113, and insulates the exposed surfaces 112c and 113e from each other.

The third insulating portion 15c is located between the extended exposed surface 113f of the third conductive plate 113, and the exposed surfaces 111b and 112c of the first conductive plate 111 and the second conductive plate 112, and insulates the extended exposed surface 113f, and the exposed surfaces 111b and 112c from each other. The third insulating portion 15c is coupled to the left ends of the first insulating portion 15a and the second insulating portion 15b.

The holding member 15 includes, as insulating portions that insulate the exposed surface of the second conductive plate 112 and the exposed surfaces of the control terminals 13 from each other, a plurality of fourth insulating portions 15d and a plurality of fifth insulating portions 15e. The holding member 15 of the present embodiment includes five fourth insulating portions 15d located on the front side of the second conductive plate 112, and five fifth insulating portions 15e located on the rear side of the second conductive plate 112. The fourth insulating portions 15d are connected to the first insulating portion 15a. The fifth insulating portions 15e are connected to the second insulating portion 15b.

As shown in FIG. 3, the fourth insulating portions 15d are located between the exposed surface 112c of the second conductive plate 112, and the exposed surfaces 13a of the control terminals 13 located on the front side of the exposed surface 112c, and insulate the exposed surface 112c and the exposed surfaces 13a from each other. Each of the fourth insulating portions 15d of the present embodiment is formed in the corresponding recess 112a in the second conductive plate 112, surrounding the exposed surface 13a of the corresponding control terminal 13. With this, the fourth insulating portion 15d includes, on the rear side of the corresponding FET 14, an insulating surface 15d1 located between the upper surface of the protrusion 112d on the exposed surface 112c of the second conductive plate 112, and the exposed surface 13a of the control terminal 13 located to the left thereof.

As shown in FIG. 4, the fifth insulating portions 15e are located between the exposed surface 112c of the second conductive plate 112, and the exposed surfaces 13a of the control terminals 13 located on the rear side of the exposed surface 112c, and insulate the exposed surface 112c and the exposed surfaces 13a from each other. Each of the fifth insulating portions 15e of the present embodiment is formed in the corresponding recess 112a in the second conductive plate 112, surrounding the exposed surface 13a of the corresponding control terminal 13. With this, the fifth insulating portion 15e includes, on the front side of the corresponding FET 14, an insulating surface 15e1 located between the upper surface of the protrusion 112d formed on the exposed surface 112c of the second conductive plate 112, and the exposed surface 13a of the control terminal 13 located to the right thereof.

The upper surfaces of the first to fifth insulating portions 15a to 15e are coplanar. Furthermore, the exposed surfaces 111b, 112c, 113d of the conductive plates 11, and the exposed surfaces 13a of the control terminals 13 are coplanar with the upper surfaces (including the insulating surfaces 15d1 and 15e1) of the insulating portions 15a to 15e of the holding member 15 (see also FIG. 1).

Source Conductive Film

As shown in FIGS. 3 and 4, the circuit assembly 10 includes a plurality of source conductive films (first conductive films) 31 to which the source terminals 14a of the FETs 14 are electrically connected. The circuit assembly 10 of the present embodiment includes the same number of (ten) source conductive films 31 as the number of FETs 14. Note that in FIGS. 1 and 2, illustration of the source conductive films 31 is omitted. The source conductive films 31 are deposited by vacuum vapor deposition, for example. The source conductive films 31 of the present embodiment are metal plating films in which a nickel plating layer is laminated on a copper plating layer.

Each of the source conductive films 31 shown in FIG. 3 is formed on the rear side of the corresponding FET 14, covering part of the exposed surface 112c of the second conductive plate 112 (the upper surface of the corresponding protrusion 112d), and part of the corresponding fourth insulating portion 15d (the right end portion of the insulating surface 15d1). The right edges of the source conductive films 31 shown in FIG. 3 are located to the left of the right edges of the upper surfaces of the respective protrusions 112d. The front edges of the source conductive films 31 shown in FIG. 3 are located so as to match the front edges of the upper surfaces of the protrusions 112d. Accordingly, only the left edges of the source conductive films 31 shown in FIG. 3 that cover part of the fourth insulating portions 15d protrude from the exposed surface 112c of the second conductive plate 112, and the remaining portions other than the left edges are arranged on the exposed surface 112c (upper surface of the protrusion 112d).

The source conductive films 31 shown in FIG. 3 have a size such that all the source terminals 14a of the corresponding FET 14 are placed thereon. All the source terminals 14a of the FETs 14 are electrically connected to the upper surfaces of the source conductive films 31 with solder or the like. With this, all the source terminals 14a of the FETs 14 are electrically connected to the exposed surface 112c of the second conductive plate 112 (upper surfaces of the protrusions 112d) via the source conductive films 31 shown in FIG. 3. Note that the source conductive films 31 shown in FIG. 3 only need to have a size such that at least only the leftmost source terminal 14a adjacent to the corresponding gate terminal 14b is placed thereon.

Each of the source conductive films 31 shown in FIG. 4 is formed on the front side of the corresponding FET 14, covering part of the exposed surface 112c of the second conductive plate 112 (the upper surface of the corresponding protrusion 112d), and part of the corresponding fifth insulating portion 15e (the left end portion of the insulating surface 15e1). The left end portions of the source conductive films 31 shown in FIG. 4 are located to the left of the right edges of the upper surfaces of the respective protrusions 112d. The rear edge of the source conductive films 31 shown in FIG. 4 are located so as to match the rear edges of the upper surfaces of the protrusions 112d. Accordingly, only the right edges of the source conductive films 31 shown in FIG. 4 that cover part of the fifth insulating portions 15e protrude from the exposed surface 112c of the second conductive plate 112, and the remaining portions other than the right edges are arranged on the exposed surface 112c (upper surface of the protrusion 112d).

The source conductive films 31 shown in FIG. 4 have a size such that all the source terminals 14a of the corresponding FET 14 are placed thereon. All the source terminals 14a of the FETs 14 are electrically connected to the upper surfaces of the source conductive film 31 via solder or the like. With this, all the source terminal 14a of the FETs 14 are electrically connected to the exposed surface 112c of the second conductive plate 112 (upper surfaces of the protrusions 112d) via the source conductive films 31 shown in FIG. 4. Note that the source conductive films 31 shown in FIG. 4 only need to have a size such that at least only the rightmost source terminal 14a adjacent to the corresponding gate terminal 14b is placed thereon.

Gate Conductive Film

In FIGS. 3 and 4, the circuit assembly 10 includes a plurality of gate conductive films (second conductive films) 32 to which the gate terminals 14b of the FETs 14 are electrically connected. The circuit assembly 10 of the present embodiment includes the same number of gate conductive films 32 (namely ten) as the number of the FETs 14.

Note that in FIGS. 1 and 2, illustration of the gate conductive films 32 is omitted. The gate conductive films 32 are deposited by vacuum vapor deposition, for example. Similar to the source conductive films 31, the gate conductive films 32 of the present embodiment are metal plating films in which a nickel plating layer is laminated on a copper plating layer.

Each of the gate conductive films 32 shown in FIG. 3 is formed on the rear side of the corresponding FET 14, covering part of the exposed surface 13a of the corresponding control terminal 13, and another part (left end of the insulating surface 15d1) of the corresponding fourth insulating portion 15d. The left edges of the gate conductive films 32 shown in FIG. 3 are located to the right of the left edges of the respective exposed surfaces 13a. The front edges of the gate conductive films 32 shown in FIG. 3 are located to the front of the front edges of the exposed surfaces 13a. The rear edges of the gate conductive films 32 shown in FIG. 3 are located to the front of the rear edges of the exposed surfaces 13a. Accordingly, the gate conductive films 32 shown in FIG. 3 cover part of the exposed surfaces 13a of the respective control terminals 13. Note that each of the gate conductive films 32 shown in FIG. 3 may also cover the entire exposed surface 13a of the corresponding control terminal 13.

The gate terminals 14b of the FETs 14 are electrically connected to the upper surfaces of the gate conductive films 32 shown in FIG. 3 with solder or the like. With this, the gate terminals 14b of the FETs 14 are electrically connected to the exposed surfaces 13a of the control terminals 13 via the gate conductive films 32 shown in FIG. 3.

The source conductive films 31 and the gate conductive films 32 shown in FIG. 3 are formed so that they satisfy the relationship W1≤W2. W1 is a distance in the left-right direction between the source conductive film 31 located on the rear side of a FET 14 and the corresponding gate conductive film 32. W2 is a terminal distance in the left-right direction between the leftmost source terminal 14a of the FET 14 and the corresponding gate terminal 14b. The terminal distance W2 is smaller than a distance W3 in the left-right direction between the exposed surface 112c located on both left and right sides of the insulating surface 15d1 (upper surface of the protrusion 112d), and the exposed surface 13a. In the present embodiment, the distance W1 between the source conductive film 31 and the gate conductive film 32 is smaller than the terminal distance W2 of the FET 14.

Each of the gate conductive films 32 shown in FIG. 4 is formed on the front side of the corresponding FET 14, covering part of the exposed surface 13a of the corresponding control terminal 13, and another part (the right end of the insulating surface 15e1) of the corresponding fifth insulating portion 15e. The right edges of the gate conductive films 32 shown in FIG. 4 are located to the left of the right edges of the exposed surfaces 13a. The front edges of the gate conductive films 32 shown in FIG. 4 are located to the rear of the front edges of the exposed surfaces 13a. The rear edges of the gate conductive films 32 shown in FIG. 4 are located to the rear of the rear edges of the exposed surfaces 13a. Accordingly, the gate conductive films 32 shown in FIG. 4 cover part of the exposed surfaces 13a of the respective control terminals 13. Note that each of the gate conductive films 32 shown in FIG. 4 may also cover the entire exposed surface 13a of the corresponding control terminal 13.

The gate terminals 14b of the FETs 14 are electrically connected to the upper surfaces of the gate conductive films 32 shown in FIG. 4 with solder or the like. With this, the gate terminals 14b of the FETs 14 are electrically connected to the exposed surfaces 13a of the control terminals 13 via the gate conductive films 32 shown in FIG. 4.

The source conductive films 31 and the gate conductive films 32 shown in FIG. 4 are formed so that they satisfy the relationship W4≤W5. W4 is a distance in the left-right direction between the source conductive film 31 located on the front side of a FET 14 and the corresponding gate conductive film 32. W5 is a terminal distance in the left-right direction between the rightmost source terminal 14a of the FET 14 and the corresponding gate terminal 14b. The terminal distance W5 is smaller than a distance W6 in the left-right direction between the exposed surface 112c located on both left and right sides of the insulating surface 15e1 (upper surface of the protrusion 112d), and the exposed surface 13a. In the present embodiment, the distance W4 between the source conductive film 31 and the gate conductive film 32 is smaller than the terminal distance W5 of the FET 14.

Effects

In the circuit assembly 10 of the present embodiment, the distances W1, W4 between the source conductive film 31 and the gate conductive film 32 are not greater than the terminal distances W2, W5 between the source terminal 14a and the gate terminal 14b of an FET 14. Accordingly, it is possible to respectively place the source terminals 14a and the gate terminal 14b of the FET 14 on the source conductive film 31 and the gate conductive film 32. Accordingly, by electrically connecting the source terminals 14a and the gate terminals 14b of the FETs 14 to the source conductive films 31 and the gate conductive films 32, the source terminals 14a are electrically connected to the exposed surface 112c of the second conductive plate 112 via the source conductive films 31, and the gate terminals 14b are electrically connected to the exposed surfaces 13a of the control terminals 13 via the gate conductive films 32. With this, even a FET 14 having terminal distances W2, W5 smaller than the distances W3, W6 between the exposed surface 112c and the exposed surfaces 13a can be mounted, and thus it is possible to enhance the versatility of the circuit assembly 10.

Since the source conductive films 31 and the gate conductive films 32 are all metal plating films, the source conductive films 31 and the gate conductive films 32 can be formed easily.

Portions of the source conductive films 31 other than the left end portion and the right end portions are arranged on the exposed surface 112c, and do not protrude from the boundary between the exposed surface 112c and the holding member 15, thus making it possible to suppress the source conductive films 31 from breaking on this boundary.

OTHER CONSIDERATIONS

The source conductive films 31 and the gate conductive films 32 of the present embodiment are deposited by vacuum vapor deposition. But the present invention is not limited to this, and the source conductive films 31 and the gate conductive films 32 may also be deposited by, for example, sputtering, printing, or the like. The source conductive films 31 of the present embodiment are electrically connected to the second conductive plate 112, but may also be electrically connected to the first conductive plate 111 or the third conductive plate 113.

In the present embodiment, the source conductive films 31 are defined as the first conductive films, and the gate conductive films 32 are defined as the second conductive films, but the gate conductive films 32 may also be defined as the first conductive films, and the source conductive films 31 may also be defined as the second conductive film. In this case, the control terminals 13 and the exposed surfaces 13a respectively serve as the first conductive members and the first exposed surfaces, and the second conductive plate 112 and the exposed surface 112c respectively serve as the second conductive member and the second exposed surface. Also, the gate terminals 14b of the FETs 14 serve as the first terminals, and the source terminals 14a thereof serve as second terminals.

The circuit assembly 10 of the present embodiment includes the source conductive films 31 and the gate conductive films 32, but a configuration is also possible in which only one type of conductive films is provided. In this case, the conductive films of the one type serve as the first conductive films.

When the circuit assembly 10 only includes the source conductive films 31, it is sufficient to electrically connect the gate terminals 14b of the FETs 14 to the exposed surfaces 13a of the control terminals 13 with solder or the like. Also, it is sufficient to form the source conductive films 31 such that they cover part of the insulating surfaces 15d1, 15e1 to the positions of the source terminals 14a while the gate terminals 14b are located on the exposed surfaces 13a. With this, by electrically connecting the source terminals 14a to the source conductive films 31, the source terminals 14a are electrically connected to the exposed surface 112c of the second conductive plate 112 via the source conductive films 31. Accordingly, even when the circuit assembly 10 only includes the source conductive films 31, it is possible to mount FETs 14 having terminal distances W2, W5 smaller than the distances W3, W6 between the exposed surface 112c and the exposed surfaces 13a.

When the circuit assembly 10 only includes the gate conductive films 32, it is sufficient to electrically connect the source terminals 14a of the FETs 14 to the exposed surface 112c of the second conductive plate 112 with solder or the like. Also, it is sufficient to form the gate conductive films 32 such that they cover part of the insulating surfaces 15d1, 15e1 to the positions of the gate terminals 14b while the source terminals 14a are located on the exposed surface 112c. With this, by electrically connecting the gate terminals 14b to the gate conductive films 32, the gate terminals 14b are electrically connected to the exposed surfaces 13a of the control terminals 13 via the gate conductive films 32. Accordingly, even when the circuit assembly 10 only includes the gate conductive films 32, it is possible to mount FETs 14 having terminal distances W2, W5 smaller than the distances W3, W6 between the exposed surface 112c and the exposed surfaces 13a.

Note that when the circuit assembly 10 only includes one type of conductive films as described above, unevenness may occur due to the film thickness of the conductive films, possibly making it difficult to mount electronic components. Therefore, taking into consideration the mounting properties of electronic components, it is preferable that the source conductive films 31 and the gate conductive films 32 be both provided as in the present embodiment.

The embodiments disclosed herein are to be construed as being exemplary and non-limiting in all respects. The scope of the present invention is not defined by the description above but is defined by the claims, and all modifications within the meaning and scope equivalent to the claims are intended to be included.

What is claimed is:

1. A circuit assembly comprising:
   a first conductive member;
   a second conductive member;
   a holding member that is insulating and holds the first conductive member and the second conductive member; and
   an electronic component that includes a first terminal and a second terminal,
   wherein the first conductive member has a first exposed surface exposed from the holding member so as to be electrically connected to the first terminal,
   the second conductive member has a second exposed surface exposed from the holding member so as to be electrically connected to the second terminal,
   the holding member includes an insulating portion located between the first exposed surface and the second exposed surface,
   a first conductive film covers at least a part of the first exposed surface and part of the insulating portion, and
   the first terminal is electrically connected to the first conductive film.

2. The circuit assembly according to claim 1, wherein the first conductive film is a metal plating film.

3. The circuit assembly according to claim 1, wherein a second conductive film covers at least a part of the second exposed surface and another part of the insulating portion, and
   the second terminal is electrically connected to the second conductive film.

4. The circuit assembly according to claim 3, wherein the second conductive film is a metal plating film.

5. The circuit assembly according to claim 3, wherein, letting a direction in which the first terminal and the second terminal of the electronic component are lined up be a first direction,
   a terminal distance, in the first direction, between the first terminal and the second terminal is smaller than a distance, in the first direction, between the first exposed surface and the second exposed surface, and
   a distance, in the first direction, between the first conductive film and the second conductive film is not greater than the terminal distance.

6. The circuit assembly according to claim 2, wherein a second conductive film covers at least a part of the second exposed surface and another part of the insulating portion, and
   the second terminal is electrically connected to the second conductive film.

7. The circuit assembly according to claim 4, wherein, letting a direction in which the first terminal and the second terminal of the electronic component are lined up be a first direction,
   a terminal distance, in the first direction, between the first terminal and the second terminal is smaller than a distance, in the first direction, between the first exposed surface and the second exposed surface, and
   a distance, in the first direction, between the first conductive film and the second conductive film is not greater than the terminal distance.

* * * * *